United States Patent [19]

Goetschi

[11] 4,409,305

[45] Oct. 11, 1983

[54] METHOD FOR PRODUCING CHARACTERS AND OTHER REPRESENTATIONS, IN PARTICULAR TITLE SET, ON A PHOTO MATERIAL

[76] Inventor: Fred A. Goetschi, Haus zum Anker, CH-6354 Vitznau, Switzerland

[21] Appl. No.: 245,516

[22] Filed: Mar. 19, 1981

[30] Foreign Application Priority Data

Sep. 23, 1980 [EP] European Pat. Off. ...... 80 105 701.9

[51] Int. Cl.³ .............................................. G03C 5/08; G03C 5/18
[52] U.S. Cl. ........................................ 430/22; 430/5; 430/141; 430/143; 430/142; 430/273; 430/320; 430/394; 430/397
[58] Field of Search ............... 430/22, 394, 5, 397, 430/143, 273, 141, 320, 142

[56] References Cited

U.S. PATENT DOCUMENTS

| | | |
|---|---|---|
| 2,883,918 | 5/1959 | Mosteller . |
| 3,527,604 | 9/1970 | Endermann et al. ............... 430/143 |
| 3,734,725 | 5/1973 | Bailey ............................ 430/22 |
| 4,094,680 | 6/1978 | Frazier .......................... 430/394 |
| 4,282,300 | 8/1981 | Wegener ......................... 430/141 |

FOREIGN PATENT DOCUMENTS 1145490 2/1962 Fed. Rep. of Germany .
2146138 9/1971 Fed. Rep. of Germany .

*Primary Examiner*—Charles L. Bowers, Jr.
*Attorney, Agent, or Firm*—Barnes, Kisselle, Raisch, Choate, Whittemore & Hulbert

[57] ABSTRACT

Photographic production of characters (11) and the like for the title set on photo material (10) which is insensitive in respect of daylight and sufficiently sensitive in respect of short-wave light. Developer liquid wettens the photo material (10) and is protected by a millimeter grid cover film (12). A recording carrier film (15) with transparent letters (16) and the like, on a colored ground which is opaque in respect of short-wave light, is laid on the photo material or cover film and moved into a condition of alignment (millimeter grid). Short-wave light of the correct amount is produced by a special flash device (20).

10 Claims, 2 Drawing Figures

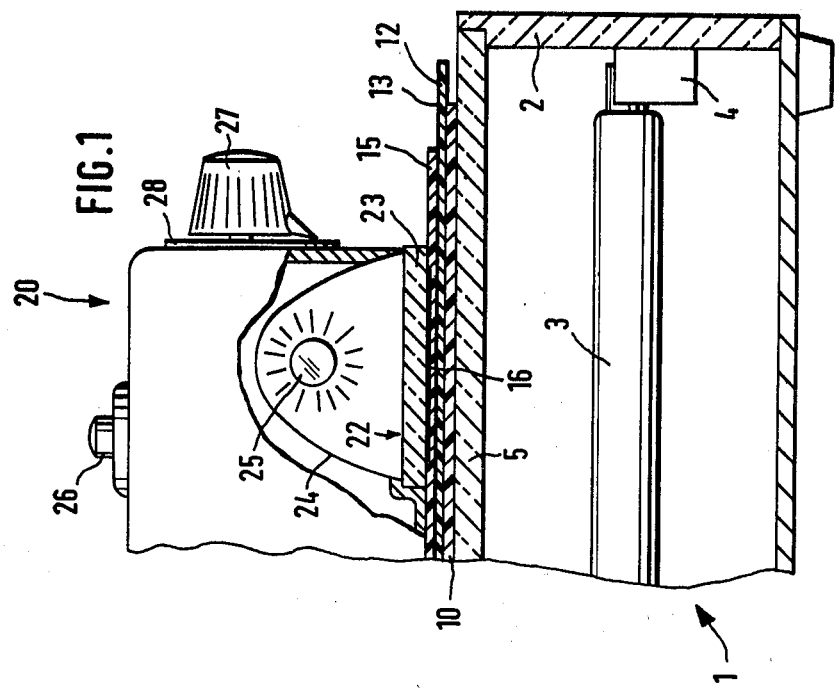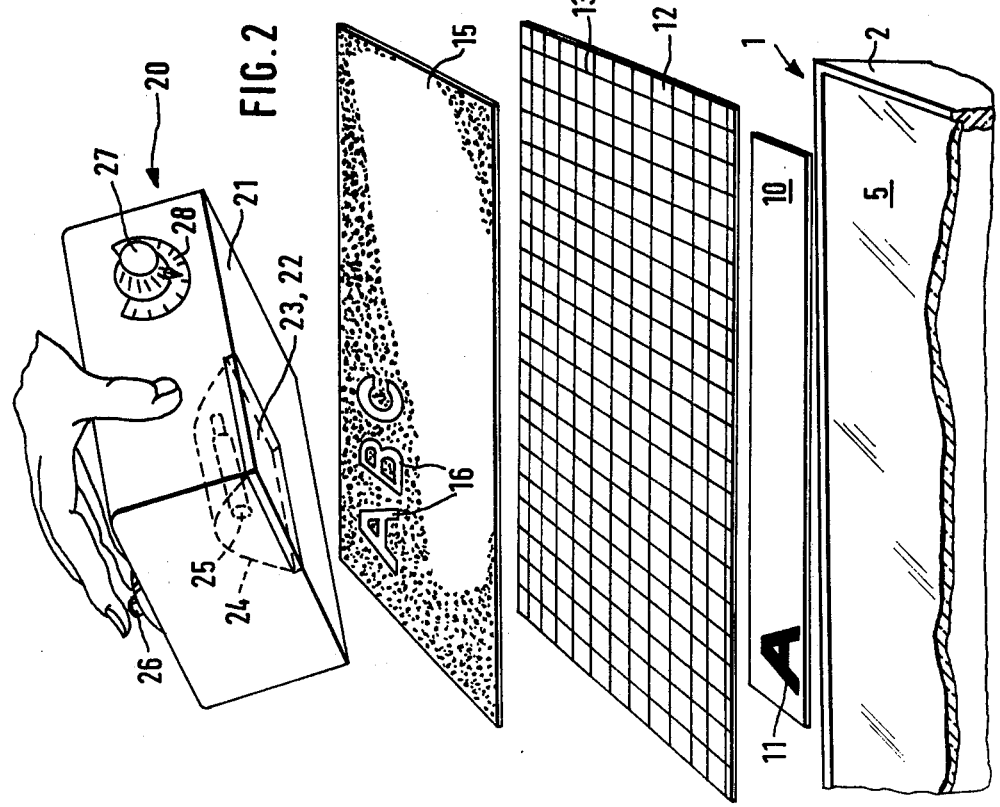

METHOD FOR PRODUCING CHARACTERS AND OTHER REPRESENTATIONS, IN PARTICULAR TITLE SET, ON A PHOTO MATERIAL

The invention relates to a method and apparatus for producing characters and other representations, in particular title set, on a photo material. There are basically three kinds of apparatuses or devices for the production of characters and the like, in particular title or head set, falling into the three following categories:

(a) Devices which can only be used in a dark room and with which the character originals are optically projected under red light on to a photo sensitive material and subsequently developed. The operation of fitting the character originals must be carried out under red light, while exposure is effected with white light.

(b) So-called daylight devices which in themselves are sealed so as to be light-tight. As, with such equipment, the exposed character or the like remains invisible, positioning must be effected by means of a marking or a mechanically actuated feed device.

(c) With so-called contact devices, the characters or the like which are to be produced are joined together in a row, in the form of positive film plates, and then copied on to photosensitive material. The photosensitive material is subsequently developed and the character plates have to be re-arranged and laid out again individually.

All known methods and apparatuses for producing title set or the like are therefore relatively complicated and carrying out such methods or operating such apparatuses requires skilled technical operators.

The present invention is based on the problem of providing a simpler method of producing title set and the like, which can be used by anyone.

The solution to the above-defined problem, in accordance with the invention, is concisely set forth in claim 1, in respect of the method, and claims 3 to 7, in respect of the apparatus.

Advantageous developments of the basic concept of the invention are set forth in the respective subsidiary claims.

The apparatus according to the invention, for producing title set and the like, is simple, the materials required can be produced or obtained at low cost, and the production operation can be easily carried out in full daylight, even by an unskilled layman.

The transparent negative film which however, outside the characters and the like to be produced, is opaque in respect of short-wave light, is laid under full daylight conditions on to the weakly photosensitive photo material (paper or film) which has previously been wetted with developer, precisely aligned by means of the blue-tinted line grid on the transparent film which covers the photo material, exposed with a special flash device in the region of the character to be produced, and immediately visibly blackened. By virtue of its transparency in the region of the character, the negative film can immediately be repositioned and exposed, after the finished character. The next character is therefore in turn already ready, and so forth. The characters are fitted into the proper position in a similar manner to rub-off characters, but the positioning operation is substantially facilitated by the interposed grid.

The pressure plate causes the superposed films to be pressed flat on to the photo material and the support surface therebelow, which produces yellow light. This eliminates light halation phenomena at the edges of the characters.

Preferably, the light-transmissive pressure plate is fixedly fitted into the light aperture of the portable flash device. This substantially simplifies operation of the apparatus.

The negative film which is opaque in respect of short-wave light outside of the characters may be for example in the form of a diazo film.

The transparent film which has the blue-tinted grid printed thereon and which is laid over the weakly photosensitive photo material which is moistened with developer liquid ensures that the developer liquid does not evaporate and the negative film laid thereover does not become moist. The line grid which facilitates positioning of the characters and the like to be produced is not also copied because the photo material does not respond to the blue colour of the grid.

An embodiment incorporating the features of the present invention is described in greater detail hereinafter with reference to a drawing in which:

FIG. 1 shows a broken-away view in vertical section through the apparatus described hereinafter, in the production of title set, and FIG. 2 shows an exploded perspective view of essential details of the apparatus shown in FIG. 1.

The apparatus according to the invention, for the production of characters and other representations, in particular title set, on a photo material, essentially includes the following components and materials:

A light box 1 which produces yellow light and which serves as a support means, a weakly photosensitive photo material 10 which is subjected to initial moistening with developer liquid, in the form of paper or film, a transparent cover film 12 which is provided with a line grid 13 (on preferably a millimeter grid system), a recording carrier film 15 for characters, symbols, pictures, photos or the like to be produced, which appear as transparent regions on an opaque background, and a portable flash device 20, also for short-wave light.

The light box 1 contains a fluorescent tube 3 which produces yellow light, in a holder 4, within a light-tight casing 2. At its top, the light box 1 is covered by a transparent support plate 5 comprising glass or the like and which is preferably so prepared by etching or the like that the yellow light produced by the fluorescent tube 3 issues upwardly from the light box 1 in a diffuse condition. The fluorescent tube 3 is supplied with power for example from the mains by way of a cable (not shown).

The photo material 10 is only weakly sensitive in the visible light range, that is to say, it is insensitive in respect of blue light, so that the characters 11 but not the blue-tinted grid 13 will appear after the material 10 is exposed with short-wave light. The finished title set can be made permanent by fixing and washing.

The transparent film 12 comprises material which is non-transmissive in respect of developer liquid. The line grid (millimeter grid) 13 printed on the film 12 is blue-tinted so that the image thereof cannot be formed on the photo material 10 which is non-responsive to the colour blue. The line grid 13 facilitates positioning of characters 16 or the like to be produced, which are carried by the negative film 15 which will now be described in detail.

In the region of the characters 16 or the like to be produced, the negative film 15 is transparent, whereas the remainder of the film 15 is of an orange or sepia colour in order not to transmit short-wave light in that part of the film. The negative film 15 may be for example in the form of a diazo film. The characters which are disposed thereon in negative form may be letters, numerals, symbols, graphic representations, photos or the like. The characters 16 to be produced are laid directly on to the transparent film 12, the line grid facilitating accurate positioning of the characters. Exposed, blackened characters can be readily recognised by means of the light box 1 which serves as a support means, and the respective following characters can then be set in proper place.

Before any operation of exposing an individual character 16, the materials or films 10, 12 and 15 which are superimposed on each other in the manner shown in FIG. 1 or FIG. 2 are pressed flat upon each other in the exposure region by a glass plate 23 of the flash device 20, which acts as a pressure plate, in order thereby to avoid light halation phenomena at the edge of the character 16 to be produced. The glass plate 23 covers a light aperture within the underside 21 of the flash device 20, the underside being in the form of a flat surface. In the present embodiment, the size of the light aperture 22 is somewhat greater than the character 16 to be produced.

A development of the concept of the invention provides that the size of the light aperture may be varied as required and may thus be adapted to different sizes of characters, by means of displaceable shutter members (not shown in the drawing).

The flash device 20 used herein includes a flash lamp 25 which, upon actuation of a trigger button 26, can be supplied with power from an incorporated or external power source (not shown). The flash device 20 is capable of producing a very large number of flashes of equal intensity, in very quick succession. The flash intensity may be varied by means of an adjusting knob 27 with a pointer, which is rotatable relative to a scale 28, for example in such a way that, in a flash operation, a greater or smaller number of equal-strength flashes are produced in succession.

As shown in FIG. 2, the glass plate 23 which also serves as the pressure plate adjoins two outside edges of the flat underside 21 of the flash device 20. This arrangement substantially facilitates positioning the flash device 20 over the character 16 to be produced, on the negative film 15.

The flash lamp 25 is surrounded within the flash device 20, by a reflector 24 which is of parabolic cross-section and which extends to the light aperture 22 and which focuses the flash light on to the light aperture 22.

I claim:

1. A method of photographically producing characters or other representations under daylight conditions, such as title set, utilizing photomaterial in sheet form which is generally insensitive with respect to daylight or blue light and having a predetermined sensitivety with respect to short-wave light, in conjunction with a suitable developer liquid, a transparent cover film which is non-transmissive with respect to said developer liquid and a record carrier film which has at least one transparent region in the form of a character, symbol, picture, photo or other like representation surrounded by a ground which is opaque with respect to short-wave light to thereby provide a photostenciling implement, including the steps of:
   (a) wetting said photomaterial with said developing liquid,
   (b) covering said wetted photomaterial with said transparent cover film,
   (c) relatively positioning said record carrier film and said transparent cover film such that said one transparent region is juxtaposed to where its projected image is to be produced on said photomaterial,
   (d) irradiating said one transparent region with short-wave light so as to activate the photomaterial in the area juxtaposed to said one transparent region to thereby provide a corresponding image on the photomaterial which becomes immediately visible to the naked eye in daylight conditions.

2. The method as set forth in claim 1 in which the record carrier film has a plurality of said transparent regions, and step (d) is followed by the further steps of:
   (e) selecting said one or another of said transparent regions of said record carrier film and relatively repositioning said carrier film and said photomaterial to juxtapose said selected region to a previously unexposed area of said photomaterial,
   (f) irradiating said selected region with short-wave light so as to activate the photomaterial in the area thereof juxtaposed to said selected region to again produce a second corresponding image on the photomaterial which becomes immediately visible to the naked eye in daylight conditions, and
   (g) repeating steps (e) and (f) with respect to successively selected transparent regions provided on said carrier film whereby visible corresponding images are developed on the photomaterial as desired.

3. The method of claim 1 further including the step of fixing said desired characters or other representations and washing said photomaterial.

4. The method of claim 1, wherein said record carrier film is pressed onto said transparent cover film during said irradiation.

5. The method of claim 1, wherein said transparent film has a line grid thereon.

6. The method of claim 5, wherein said line grid is blue-tinted.

7. The method of claim 1, wherein said ground of said record carrier film is colored.

8. The method of claim 7, wherein said color is orange or sepia.

9. The method of claim 1, wherein said record carrier film is a diazo film.

10. The method as set forth in claim 2 wherein said transparent cover film has a line grid thereon which is blue tinted, wherein said ground of said record carrier film is colored orange or sepia and said record carrier film is a diazo film, and including the further steps of pressing said record carrier film onto said transparent cover film during each irradiation step, and, after all desired irradiation steps are completed, fixing the visible images so produced upon the photomaterial and thereafter washing said photomaterial to make the finished developed layout of characters or other representations permanent on said photomaterial.

* * * * *